United States Patent [19]
Kanada et al.

[11] Patent Number: 4,784,933
[45] Date of Patent: Nov. 15, 1988

[54] METHOD FOR MAKING LITHOGRAPHIC PRINTING PLATE USING LIGHT WAVELENGTHS OVER 700 μM

[75] Inventors: Eiji Kanada; Yasuo Tsubai; Akira Tanaka; Toshiro Kondo; Yoshikazu Takaya; Masahiko Saikawa; Hiroshi Nishinoiri, all of Nagaokakyo, Japan

[73] Assignee: Mitsubishi Paper Mills, Ltd., Tokyo, Japan

[21] Appl. No.: 929,477

[22] Filed: Nov. 12, 1986

[30] Foreign Application Priority Data

Nov. 12, 1985 [JP] Japan .................................. 60-254202
Aug. 14, 1986 [JP] Japan .................................. 61-191476

[51] Int. Cl.$^4$ ............................ G03C 5/54; G03F 7/06
[52] U.S. Cl. .................................. 430/204; 430/230; 430/246; 430/251; 430/944
[58] Field of Search ............... 430/204, 230, 246, 251, 430/944

[56] References Cited

U.S. PATENT DOCUMENTS 3,728,114  4/1973  Futaki et al. ........................ 430/204
4,160,670  7/1979  Tsubai et al. ....................... 430/204
4,297,429  10/1981 Kanada et al. ...................... 430/204
4,501,811  2/1985  Saikawa et al. ..................... 430/204

Primary Examiner—Richard L. Schilling
Attorney, Agent, or Firm—Cushman, Darby & Cushman

[57] ABSTRACT

Lithographic printing plates which have such a high sensitivity as permitting use of semiconductor laser beam of low output, a high resolving power and a high printing endurance and are free from occurrence of scumming are made by a method which comprises imagewise exposing a light sensitive material which comprises a support and at least a silver halide emulsion layer and a surface physical development nuclei layer provided on the support, said emulsion layer comprising silver halide grains which contain at least silver bromide and containing at least one sensitizing dye having a maximum spectral sensitivity in the region of longer than 700 μm and then developing the exposed light sensitive material with a silver complex diffusion transfer developer containing at least a thiocyanate. Further improvement can be obtained by providing an antihalation means to keep the reflectance of a light of longer than 700 μm at 13–40%.

14 Claims, No Drawings

METHOD FOR MAKING LITHOGRAPHIC PRINTING PLATE USING LIGHT WAVELENGTHS OVER 700 μM

BACKGROUND OF THE INVENTION

This invention relates to a method for making a lithographic printing plate which utilizes silver complex diffusion transfer process suitable for using laser light, especially semiconductor laser light as a light source.

Lithographic printing plates which use transferred silver images formed by the silver complex diffusion transfer process as ink receptive areas are disclosed in Japanese Patent Examined Publication (Kokoku) No. 30562/73 and Japanese Patent Unexamined Publication (Kokai) Nos. 21602/78, 103104/79, 9750/81, etc. and they are well known.

According to a typical silver complex diffusion transfer process suitable for making these lithographic printing plates, a light sensitive material which comprises a support and a subbing layer which serves also as an anti-halation layer, a silver halide emulsion layer and a physical development nuclei layer provided on said support is exposed imagewise and developed, whereby silver halide of latent image area becomes black silver in the emulsion layer and simultaneously silver halide of non-latent image area is dissolved by the action of a silver halide complexing agent contained in a processing solution and diffuses to the surface of the light sensitive material. Thus dissolved and diffusing silver complex salt is deposited as silver image on the physical development nuclei in the surface layer by reducing action of developing agent. Following the development, if necessary, the material is subjected to a sensitizing treatment to increase ink receptivity of the silver image. Then, thus obtained lithographic printing plate was mounted on an offset printing machine and printing is carried out by transferring the inked image to a substrate.

According to the conventional method, the silver halide emulsion layer is subjected to spectral sensitization by a merocyanine or cyanine dye so that the emulsion can have a sensitivity maximum in green radiation region of near 550 nm and the emulsion is subjected to exposure for several-several ten seconds by a process camera using an ordinary light source such as tungsten light source. Such conventional method, however, has a limit even when the above-stated lithographic printing plates which are inherently excellent in sharpness and resolution are used. Besides, there are the problems that when a color print is produced from a color original, not only the resolution is still insufficient, but production of the light sensitive material and making of lithographic printing plates are complicated.

Use of laser light for plate making has been proposed as a method for solution of the above problems. For example, lithographic printing plates to which helium-neon laser or light emitting diode is applied are disclosed in U.S. Pat. No. 4,501,811 and Japanese Patent Unexamined Publication (Kokai) Nos. 71055/84, 75838/85, 100148/85, etc. As also described in these patent documents, in the case of these lithographic printing plates which utilize the silver complex diffusion transfer process, since the surface physical development nuclei layer gives a great effect on the spectral sensitization, the objective sensitivity to laser beam is reduced or shelf stability is deteriorated and moreover, since a low contrast transfer silver image is precipitated by silver complex diffusion transfer development, sharpness and resolution are decreased and furthermore, there occur scumming of non-image area and dropout of silver image during printing, which make it impossible to obtain sufficient printing endurance. Thus, it is difficult to make the desired lithographic printing plates of good quality. Therefore, a desired sensitizing dye should meet all of the following requirements: sufficiently high sensitivity to the radiation wavelength from lasers; good shelf stability; formation of a high contrast silver image; no adverse effect such as scumming; and formation of a transferred and precipitated silver having a sufficient strength to keep even small silver particles from dropping out during printing.

Japanese Patent Unexamined Publication (Kokai) No. 75838/85 discloses that in plate making with helium-neon laser beam of 632.8 mμ, resolving power and printing endurance can be improved by providing an antihalation layer of less than 10% in reflectance.

As for the lasers, there are known various types, the method which uses laser sources such as helium-neon, argon, etc. as those for scanner type have the defects such as large and expensive devices required, low consumption power efficiency, etc. On the other hand, semiconductor lasers have the advantages that they are small in size and inexpensive, modulation can be easily performed and they have a long shelf life. For the semiconductor lasers, there are used such series of semiconductors as Ga/As/P, Ga/Al/As, Ga/As, In/P, In/As, etc. and wavelength of these laser beams is generally longer than 700 mμ and mostly longer than 750 mμ.

Light sensitive materials for lithographic printing plates which employ such semiconductor laser beams of longer wavelength as light sources for image exposure are disclosed in Japanese Patent Unexamined Publication (Kokai) No. 61752/85. This specification mentions, as an especially preferred embodiment, a light sensitive material for lithographic printing plate which comprises a support and a non-silver light sensitive layer capable of forming an oleophilic image (for example, comprising an o-naphthoquinone compound) and a light sensitive silver halide emulsion layer provided in this order on said support and discloses sensitizing dyes represented by the general formulas (I)-(IV) used in the above emulsion layer and having a maximum spectral sensitivity in the region longer than 700 mμ.

However, according to the inventors' research, when a sensitizing dye having a maximum spectral sensitivity in the infrared region of longer than 700 mμ as contained in a silver halide emulsion layer of the above mentioned lithographic printing plate having a physical development nuclei layer as an outermost surface layer, such lithographic printing plate has been found to have the defects that the precipitated silver in the surface physical development nuclei layer is apt to drop out during printing and only low printing endurance can be obtained as compared with a conventional lithographic printing plate containing a sensitizing dye having a maximum spectral sensitivity to visible light (shorter than 700 mμ), though there may be some sensitizing dyes having a relatively high sensitivity in plate making with semiconductor laser beam. The cause is not clear, but it can be considered that sensitizing dyes for infrared ray have a long methine chain such as pentamethine chain or heptamethine chain and are unstable as compared with sensitizing dyes for visible light having a trimethine chain and thus the sensitizing dyes for infrared ray could decompose during preparation of emulsion, coating of nuclei composition or preservation of lithographic printing plate or be desorbed from silver halide to give some effects on formation, diffusion and physical development of complex salt of silver halide. Furthermore, although lithographic printing plates having a silver halide emulsion layer containing the above sensitizing dyes, an antihalation layer of less than 10% in reflectance to semiconductor laser diode beams of near infrared region and a surface physical development nuclei layer have had sufficiently high printing endurance, they are very low in sensitivity to laser diode output device. When reflectance of the antihalation layer is increased for increasing the sensitivity to some extent, printing endurance decreases and it has been hitherto very difficult to satisfy all of the high sensitivity, high resolving power and high printing endurance.

SUMMARY OF THE INVENTION

The object of this invention is to provide a method for making a lithographic printing plate by utilizing the silver complex diffusion transfer process which has such a high sensitivity as permitting use of semiconductor laser beam of low output, a high resolving power and a high printing endurance and is free from occurrence of scumming.

DESCRIPTION OF THE INVENTION

The above object has been attained by the plate making method which comprises imagewise exposing a light sensitive material comprising a support and at least a silver halide emulsion layer and a surface physical development nuclei layer, said emulsion layer comprising silver halide grains which contain at least silver bromide and containing at least one sensitizing dye having a maximum spectral sensitivity in the region of longer than 700 m$\mu$, and then developing the exposed light sensitive material with a silver complex diffusion transfer developer which contains at least a thiocyanate.

One embodiment of this invention is such a plate making method which comprises subjecting a light sensitive material comprising a support and at least a silver halide emulsion layer and a surface physical development nuclei layer to a scanning exposure of high-intensity short-time, namely, a scanning beam of longer than 700 m$\mu$, an antihalation means to keep the reflectance to a scanning exposure beam of longer than 700 m$\mu$ at 13–40% being provided under the emulsion layer and said emulsion layer comprising silver halide grains which contain at least silver bromide and containing at least one sensitizing dye having a maximum spectral sensitivity in the region of 700 m$\mu$ or longer in an amount of $3 \times 10^{-5}$–$3 \times 10^{-4}$ mole for 1 mole of silver halide and then developing thus exposed material with a diffusion transfer developer which contains at least a thiocyanate.

This invention will be explained in more detail below.

The sensitizing dyes having a maximum spectral sensitivity in the region of longer than 700 m$\mu$ which are used in this invention can be those as mentioned in U.S. Pat. Nos. 2,095,854, 2,095,856, 2,955,939, 3,482,978, 3,552,974, 3,573,921, 3,582,344, 3,623,881, etc.

Preferred are those which are represented by the following general formula (I)–(IV).

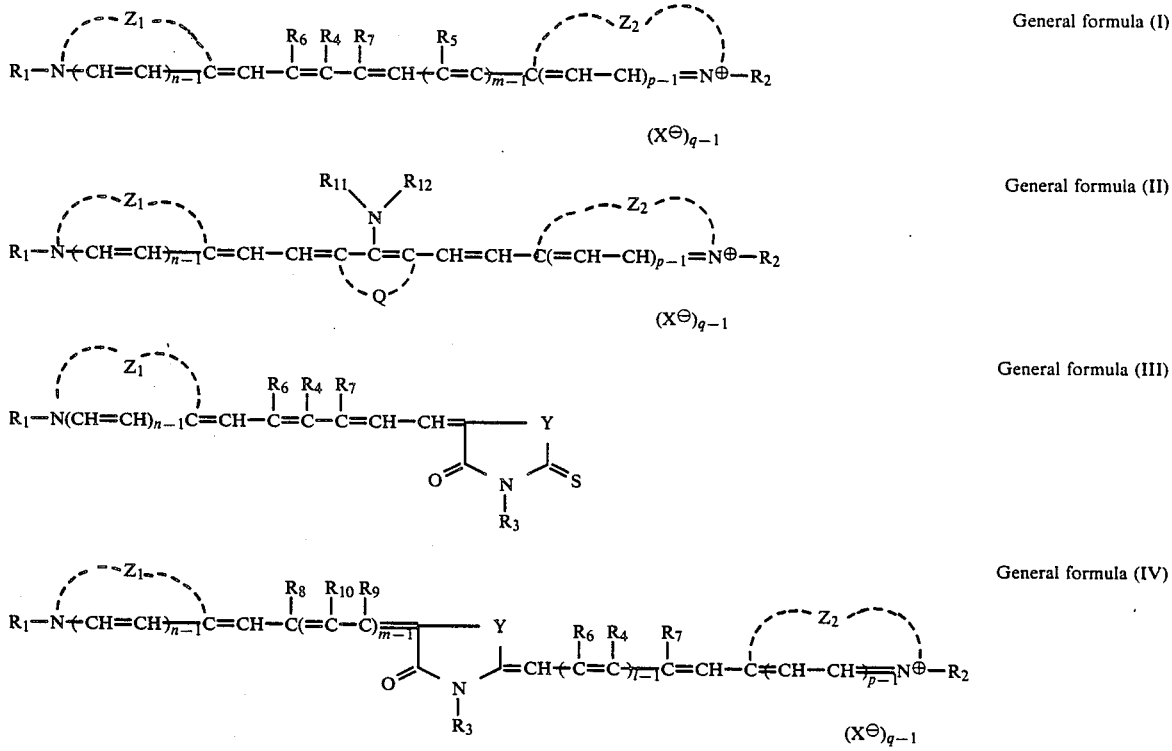

General formula (I)

General formula (II)

General formula (III)

General formula (IV)

In the general formulas (I)–(IV), $Z_1$ and $Z_2$ which may be identical or different represent a group of atoms necessary for forming a 5- or 6-membered nitrogen-containing heterocyclic ring; $R_1$ and $R_2$ which may be identical or different represent alkyl group or alkenyl group; $R_3$ represents an alkyl group, an alkenyl group or an aryl group; $R_4$–$R_{10}$ which may be identical or different represent hydrogen atom, halogen atom, alkyl group, aryl group or alkoxy group and $R_6$ and $R_7$ or $R_8$ and $R_9$ may link to each other to form a 5- or 6-membered ring;

$R_{11}$ and $R_{12}$ which may be identical or different represent alkyl group or aryl group and $R_{11}$ and $R_{12}$ may link to each other to form a 5- or 6-membered ring; Y represents sulfur atom, oxygen atom or $>N-R_{13}$ ($R_{13}$ represents an alkyl group); X represents an acid anion; and l, m, n, p and q represent 1 or 2.

As examples of $Z_1$ and $Z_2$, mention may be made of nitrogen containing heterocyclic rings such as thiazole, benzothiazole, naphtho[1,2-d]thiazole, naphtho[2,1-d]thiazole, naphtho[2,3-d]thiazole, selenazole, benzoselenazole, naphtho[2,1-d]selenazole, naphtho[1,2-d]selenazole, oxazole, benzoxazole, naphtho[1,2-d]oxazole, naphtho[2,1-d]oxazole, naphtho[2,3-d]oxazole, 2-quinoline, 4-quinoline, 3,3-dialkylindolenine, imidazole, benzimidazole, naphtho[1,2-d]imidazole, pyridine, etc. These heterocyclic rings may have one or more substituents such as alkyl groups (e.g., methyl, ethyl, butyl, trifluoromethyl, etc.), aryl groups (e.g., phenyl, tolyl, etc.), hydroxyl group, alkoxy groups (e.g., methoxy, ethoxy, butoxy, etc.), carboxyl group, alkoxycarbonyl groups (e.g., methoxycarbonyl, ethoxycarbonyl, etc.), halogen atoms (e.g., fluorine, chlorine, bromine and iodine), aralkyl groups (e.g., benzyl, phenethyl, etc.), cyano group, alkenyl groups (e.g., allyl, etc.), etc.

For $R_1$ and $R_2$, alkyl groups include lower alkyl groups such as methyl, ethyl, propyl, butyl, etc., hydroxyalkyl groups such as β-hydroxyethyl, γ-hydroxypropyl, etc., alkoxyalkyl groups such as β-methoxyethyl, γ-methoxypropyl, etc., acyloxyalkyl groups such as β-acetoxyethyl, γ-acetoxypropyl, β-benzoyloxyethyl, etc., carboxyalkyl groups such as carboxymethyl, β-carboxyethyl, etc., alkoxycarbonylalkyl groups such as methoxycarbonylmethyl, ethoxycarbonylmethyl, β-ethoxycarbonylethyl, etc., sulfoalkyl groups such as β-sulfoethyl, γ-sulfopropyl, δ-sulfobutyl, etc., aralkyl groups such as benzyl, phenethyl, sulfobenzyl, etc. and alkenyl groups include allyl, etc.

Examples of $R_3$ are alkyl and alkenyl groups as enumerated for said $R_1$ and $R_2$ and aryl groups such as phenyl, tolyl, methoxyphenyl, chlorophenyl, naphthyl, etc.

Examples of $R_4-R_{10}$ are hydrogen atom, halogen atoms such as chlorine, bromine, iodine and fluorine, alkyl and aryl groups as enumerated for $R_1$, $R_2$ and $R_3$ and alkyl-containing alkoxy groups (i.e., $OR_1$ group) as enumerated for $R_1$ and $R_2$ and 5- or 6-membered rings formed by $R_6$ and $R_7$ or $R_8$ and $R_9$ may be substituted with lower alkyl groups, etc. Examples of $R_{11}$ and $R_{12}$ are alkyl and aryl groups as enumerated for $R_1$, $R_2$ and $R_3$ and $R_{11}$ and $R_{12}$ may link to each other to form a 5- or 6-membered ring. Examples of $R_{13}$ are alkyl groups as enumerated for $R_1$ and $R_2$. Examples of the acid anions for X are alkylsulfate ions such as those of methylsulfuric acid, ethylsulfuric acid, etc. thiocyanate ion, toluenesulfonate ion, halogen ions such as chlorine, bromine, iodine, etc. and perchlorate ion. X is not present when the dye has a structure similar to betaine.

Typical examples of the sensitizing dyes used in this invention are shown below.

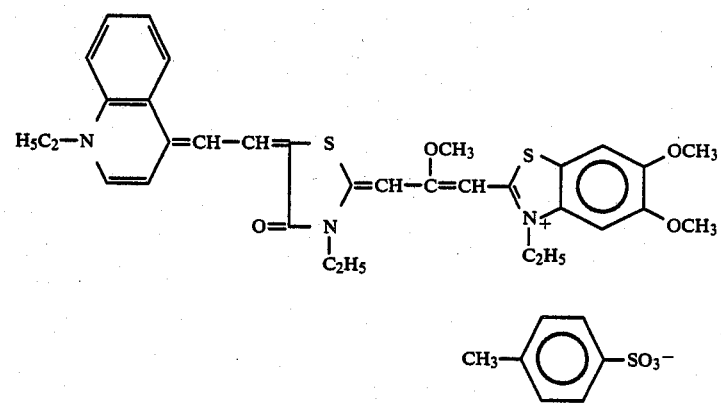

(1)

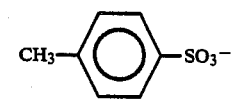

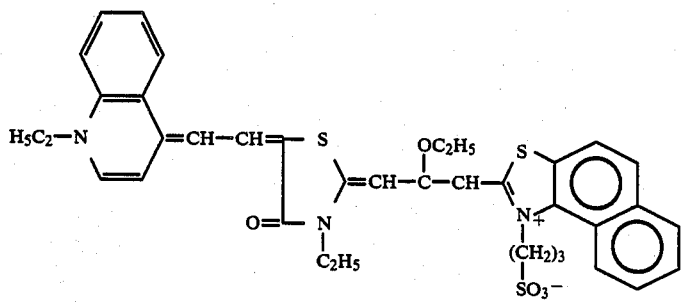

(2)

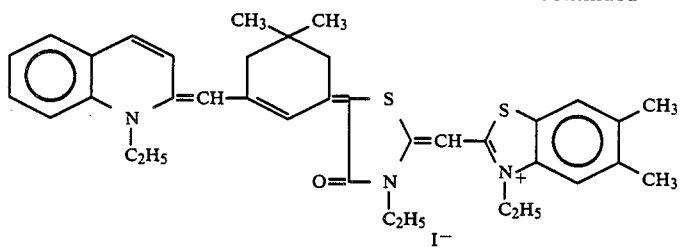
(3)
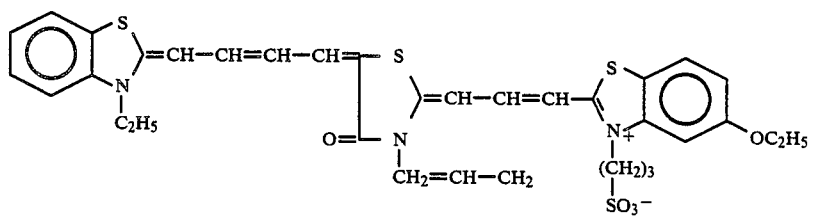
(4)
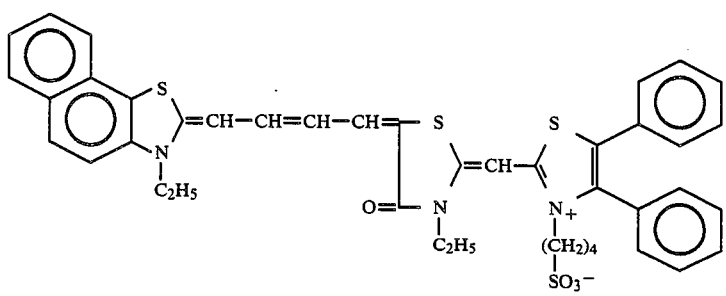
(5)
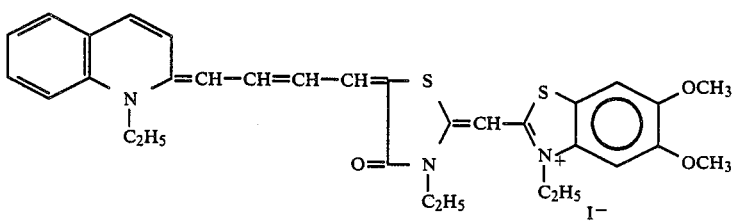
(6)
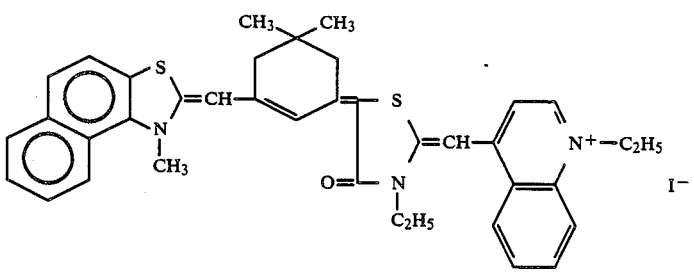
(7)
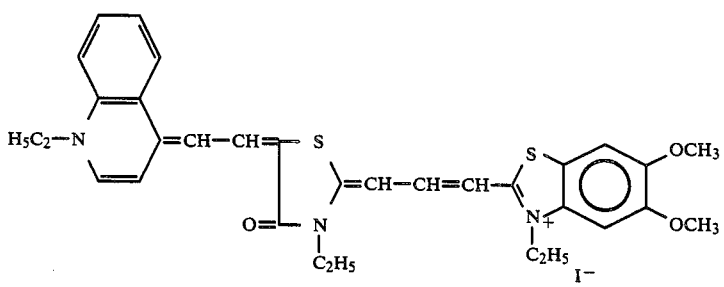
(8)

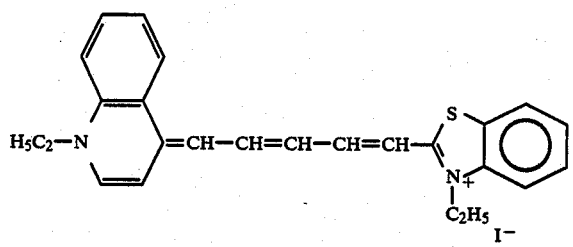
(9)
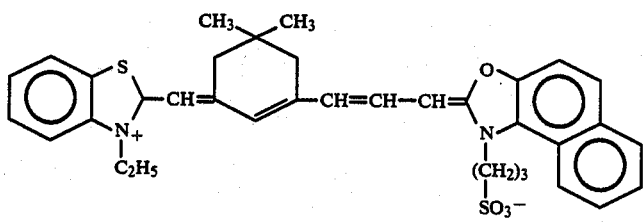
(10)
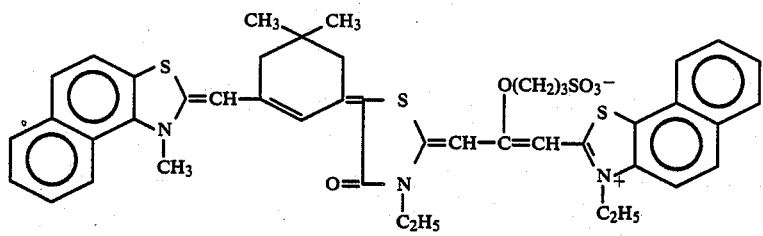
(11)
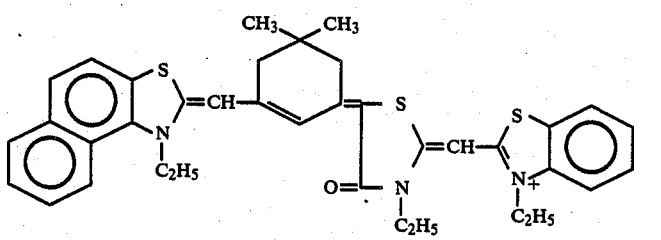
(12)
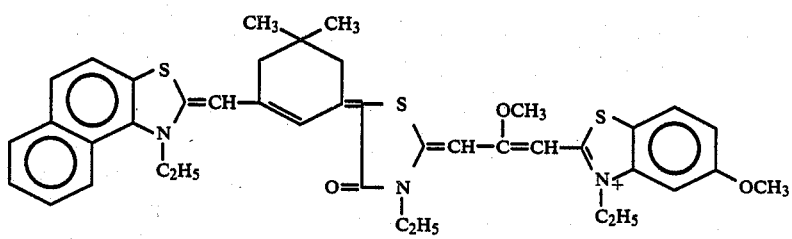
(13)
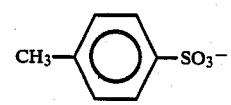

-continued
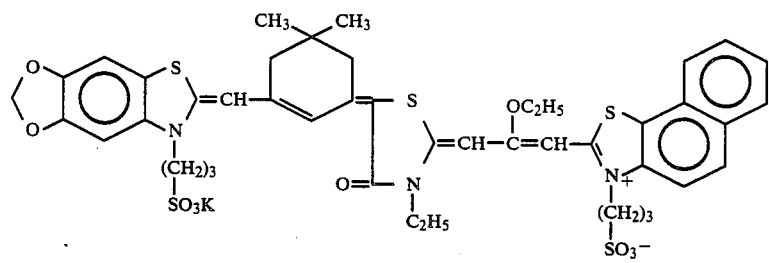 (14)
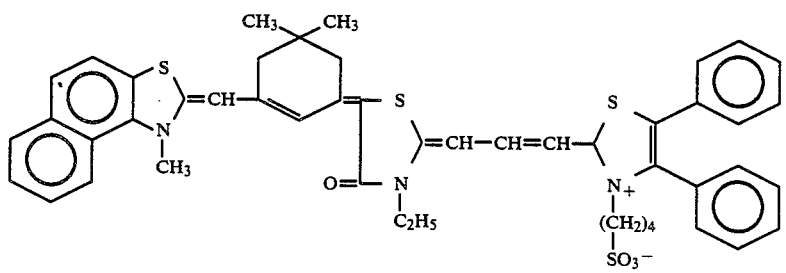 (15)
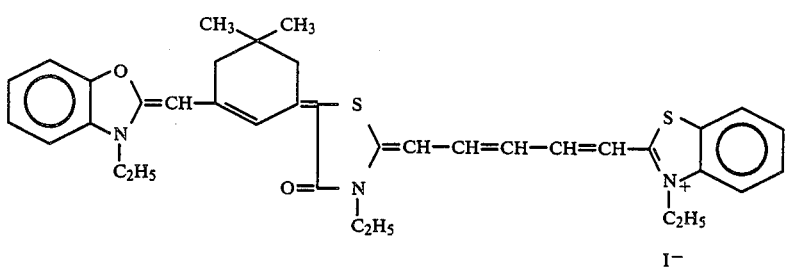 (16)
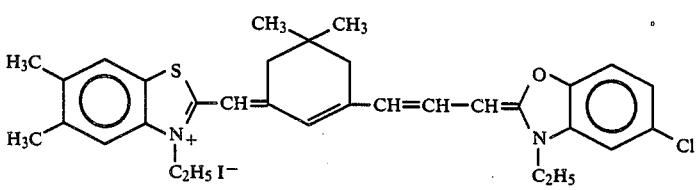 (17)
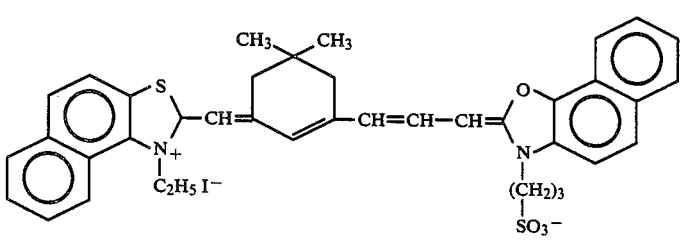 (18)
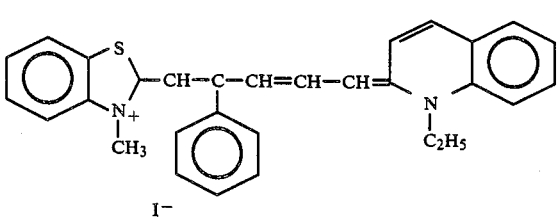 (19)

-continued
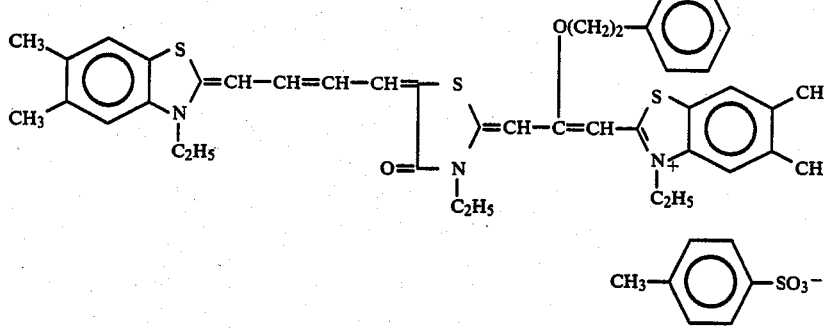 (20)
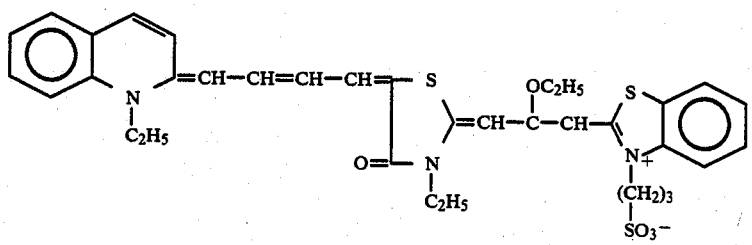 (21)
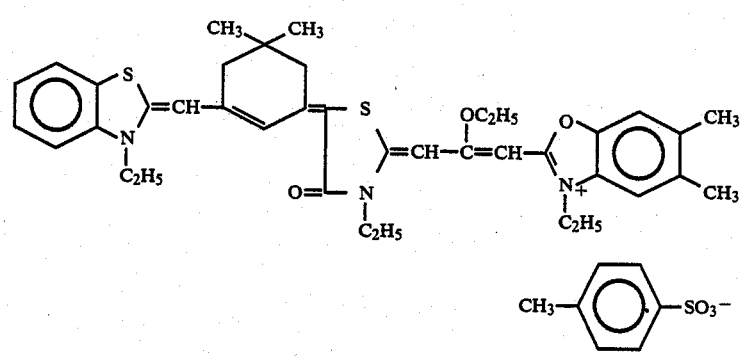 (22)
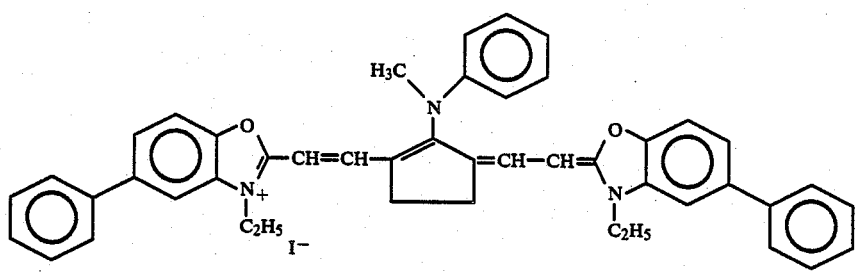 (23)
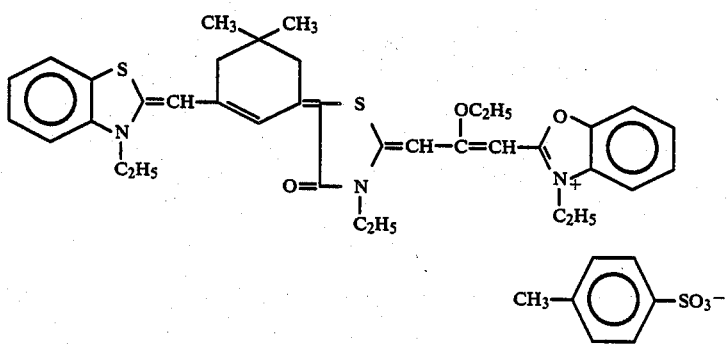 (24)

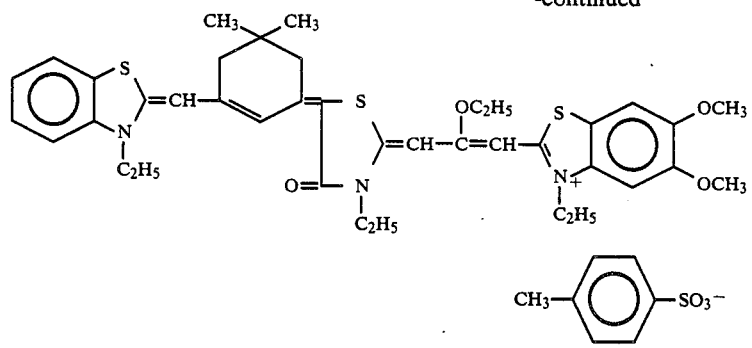
(25)
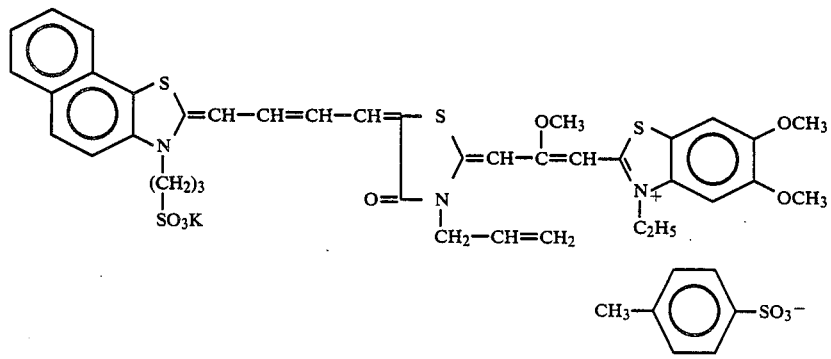
(26)
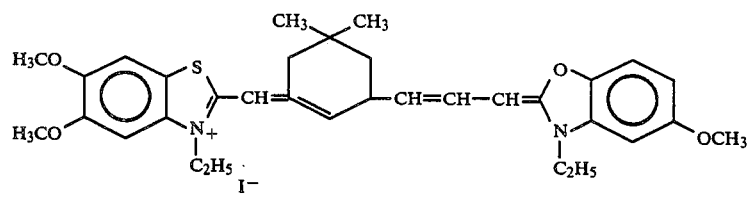
(27)
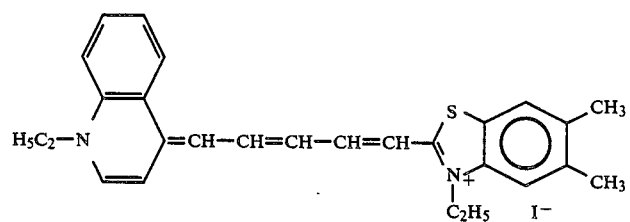
(28)
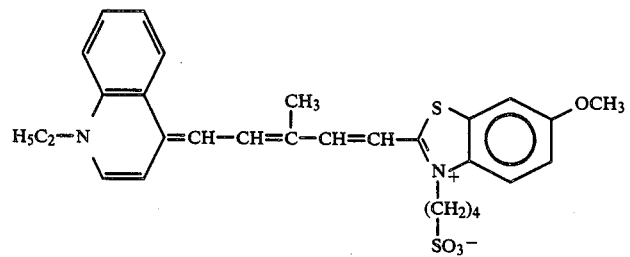
(29)
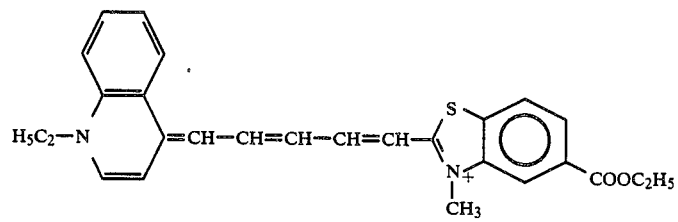
(30)

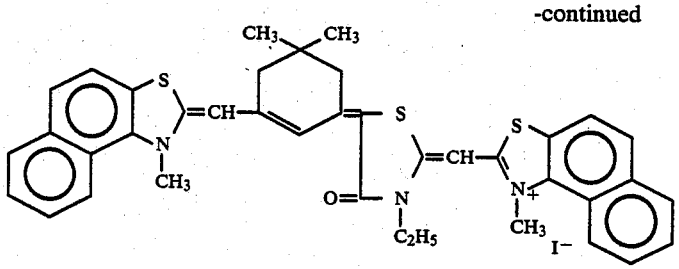

(31)

The sensitizing dyes used in this invention can be synthesized by the methods known to those skilled in the art. The dye can be added to the silver halide emulsion at any time before coating the emulsion. The amount to be added may be varied in a wide range, but is generally in the range of $1\times10^{-5}$–$1\times10^{-2}$ mole for 1 mole of silver halide for good results, the optimum amount being dependent on the type of silver halide such as halogen composition, average grain size as well as crystal habit of the silver halide. The amount is preferably $3\times10^{-5}$–$3\times10^{-4}$ mole for 1 mole of silver halide when combined with antihalation means in accordance with a preferred embodiment explained herein below.

The silver halide emulsion used in this invention comprises a silver halide containing at least silver bromide, preferably silver chlorobromide or silver chloroiodobromide containing preferably about 3-about 60 mole%, especially preferably about 5-about 50 mole% of silver bromide. Silver iodide is contained preferably in the range of about 0.01-about 2 mole%. The average grain size of these silver halides is preferably in the range of 0.2–0.8μ, though other grain sizes are usable. The emulsion is preferably monodispersion of silver halide grains, 90% or more of total grains having a size within ±30% of the average size. The grains are preferably in the form of substantially cube or fourteenfaced polyhedron, though those having other crystal habits are not objectionable.

According to the preferred embodiment of this invention, in the plate making method explained hereinbefore, an antihalation means is provided under the silver halide emulsion layer to adjust the reflectance of a scanning exposure light of longer than 700 mμ, to 13%–40% with using the sensitizing dyes in an amount of $3\times10^{-5}$–$3\times10^{-4}$ mole for 1 mole of silver halide and exposure is effected with a scanning light of longer than 700 mμ. According to this method, high sensitivity fully adaptable to the output of laser diode can be obtained, the above mentioned defect of reduction of printing endurance is completely removed and thus lithographic printing plates of high printing endurance and high resolving power can be obtained.

More preferred amount of the sensitizing dyes is $4\times10^{-4}$–$2\times10^{-4}$ mole for 1 mole of silver halide.

At least one of the undercoat layer, the support and the backing layer is subjected to antihalation treatment so that a scanning exposure beam, for example, a laser diode beam of 780 mμ is reflected at a reflectance of 13%–40%, more preferably 14%–35%.

Such antihalation can provide the higher sensitivity as compared with the antihalation of 3% or 8% in reflectance disclosed in the above stated Japanese Patent Unexamined Publication (Kokai) No. 75838/85 and it has been found unexpectedly that reduction of resolving power caused by use of laser scanner process can be practically ignored.

The antihalation applied to at least one of the undercoat layer, the support and the backing layer is performed using materials capable of absorbing laser beams longer than 700 mμ, preferably longer than 750 mμ, for example, black pigments such as carbon black, penta or heptamethineoxonol dyes, etc.

The antihalation is preferably applied to at least the undercoat layer contiguous to the emulsion layer.

The silver halide emulsion used in this invention comprises a silver halide containing at least silver bromide, preferably silver chlorobromide or silver chloroiodobromide containing preferably about 3-about 60 mole%, especially preferably about 5-about 50 mole% of silver bromide. Silver iodide is contained preferably in the range of about 0.01-about 2 mole%. The average grain size of these silver halides is preferably in the range of 0.2–0.8μ, though other grain sizes are usable. The emulsion is preferably monodispersion of silver halide grains, 90% or more of total grains having a size within ±30% of the average size. The grains are preferably in the form of substantially cube or fourteenfaced polyhedron, though those having other crystal habits are not objectionable.

The binder used in the silver halide emulsion of the lithographic printing plate of this invention is usually gelatin which can be partially replaced with one or more hydrophilic polymer binders such as starch, albumin, sodium alginate, hydroxyethylcellulose, gum arabic, polyvinyl alcohol, carboxymethylcellulose, polyvinyl pyrrolidone, polyacrylamide, styrene-maleic anhydride copolymer, polyvinyl methyl ether-maleic anhydride copolymer, etc. It is further possible to use an aqueous dispersion (latex) of vinyl polymers.

The silver halide emulsion can be sensitized in various ways during its preparation or coating. The emulsion is preferably sensitized chemically by the methods well known to the art by using, for example, sodium thiosulfate, alkylthioureas, or gold compounds such as gold rhodanide and gold chloride or mixtures.

Those characteristics such as high sensitivity, high sharpness and high resolving power which are desirable for the direct processing printing plates may be imparted by adding, at any time during the emulsion preparation, compounds of metals of Group VIII of the periodic table, such as, for example, salts of cobalt, nickel, rhodium, palladium, iridium and platinum. The amount of addition is in the range of $10^{-8}$–$10^{-3}$ mole for 1 mole of silver halide. The silver halide emulsion layer may contain other additives such as coating aids, hardeners, anti-foggants, matting agents (water-holding agents), and developing agents which are customarily used.

A subbing layer for improving adhesion or an undercoat layer which may contain a coloring agent such as carbon black and a compound absorbing a light of at least 700 mμ may be provided below the silver halide emulsion layer (and above the support). This undercoat layer may further contain a developing agent or a matting agent.

An image receiving layer is provided above the silver halide emulsion layer, namely, as an outermost surface layer. If this is provided under the emulsion layer, no or a little effect can only be obtained. The image receiving layer contains known physical development nuclei such as metals including antimony, bismuth, cadmium, cobalt, palladium, nickel, silver, lead, zinc, etc. and sulfides thereof, etc. The image receiving layer may contain at least one hydrophilic colloid such as gelatin, carboxymethylcellulose, gum arabic, sodium alginate, hydroxyethyl starch, dialdehyde starch, dextrin, hydroxyethylcellulose, polystyrenesulfonic acid, a vinylimidazole-acrylamide copolymer, polyvinyl alcohol, etc. This hydrophilic colloid contained in the image receiving layer is preferably 0.1 g/m$^2$ or less. The image receiving layer may further contain hygroscopic substances or wetting agents such as sorbitol, glycerol, etc. It may further contain anti-scumming pigments such as barium sulfate, titanium dioxide, China clay, silver, etc., developing agents such as hydroquinone and hardeners such as formaldehyde, dichloro-S-triazine, etc.

The supports may be paper, films such as cellulose acetate film, polyvinyl acetal film, polystyrene film, polypropylene film, polyethylene terephthalate film, etc., composite films such as polyester, polypropylene, or polystyrene films coated with polyethylene film; metals; metallized paper; or metal/paper laminates. A paper support coated on one or both sides with an olefin polymer such as polyethylene is also useful. These supports may contain compounds having antihalation powder.

The diffusion transfer processing solution used in this invention contains at least a thiocyanate as a silver halide solvent. As the thiocyanate, there may be used potassium thiocyanate, sodium thiocyanate, ammonium thiocyanate, etc. Amount of the thiocyanate to be used is about 0.05–0.3 mole, preferably about 0.1–0.25 mole per 1 l of the processing solution.

U.S. Pat. Nos. 4,297,429, 4,297,430 and 4,355,090 disclose that such silver halide solvents as 2-mercaptobezoic acid, cyclic imides (such as uracil), etc. can provide lithographic printing plates good in printing endurance and these silver halide solvents have been practically used. However, these are insufficient to obtain printing endurance of practically usable level of lithographic printing plates in which a silver chlorobromide or chloroiodide emulsion contains the above mentioned sensitizing dyes. Further, it has been found that in general silver chloride emulsions are advantageous with respect to printing endurance, but are not suitable to use with the above mentioned sensitizing dyes because of severe reduction of printing endurance caused by these dyes. In this invention, it is possible to use such silver halide solvents as 2-mercaptobezoic acid, uracil, various amines, thiosulfates, etc. in addition to the thiocyanate.

The processing solution for development used in this invention may contain, in addition to the above silver halide solvents, alkaline substances such as sodium hydroxide, potassium hydroxide, lithium hydroxide, sodium tertiary phosphate, etc.; preservatives such as sodium sulfite, potassium sulfite, etc.; thickening agents such as hydroxyethylcellulose, carboxymethylcellulose, etc.; antifoggants such as potassium bromide, 1-phenyl-5-mercaptotetrazole, compounds described in Japanese Patent Unexamined Publication (Kokai) No. 26201/72, etc.; developing agents such as hydroquinone, 1-phenyl-3-pyrazolidone, etc.; development modifiers such as polyoxyalkylene compounds, onium compounds, etc.

When the silver complex diffusion transfer process is carried out, the developing agent may be contained in the silver halide emulsion layer and/or the image receiving layer or other water permeable layers contiguous to the image receiving layer as described in British Pat. Nos. 1,000,115, 1,012,476, 1,017,273, and 1,042,477. Therefore, in such case, use may be made of a so-called "alkaline activating solution" containing no developing agent.

The lithographic printing plates made in accordance with this invention can be rendered ink receptive or enhanced in ink receptivity by use of such compounds as described in Japanese Patent Examined Publication (Kokoku) No. 29723/73 and U.S. Pat. No. 3,721,539.

The following nonlimiting examples will further illustrate this invention.

EXAMPLE 1

On one side of a subbed polyester film support, was provided a matting layer containing silica powder of 5μ in average particle size. On another side were provided an undercoat layer containing carbon black and 20% by weight (based on photographic gelatin) of silica powders of 7μ in average particle size and a silver halide emulsion layer (adjusted to pH 4.5) containing 5% by weight (based on photographic gelatin) of silica powders of 7μ in average particle size after subjected to chemical sensitization with a gold compound and hypo.

The above silver halide emulsion contained $10^{-3}$ mole of sensitizing dye (25) for 1 mole of silver halide and $5 \times 10^{-6}$ mole of rhodium chloride for 1 mole of silver halide which had been added during physical ripening of the emulsion. The silver halide grains, in substantially cubic form, were 0.4μ in average size and 90% or more of the total grains were distributed within ±30% of the average grain size.

The application rate of gelatin in the undercoat layer was 3.0 g/m$^2$, that of gelatin in the emulsion layer was 1.0 g/m$^2$ and that of silver halide was 0.8 g/m$^2$ in terms of silver nitrate. These undercoat layers and the emulsion layer contained 5.0 mg of formaldehyde as hardener for 1 g of gelatin. After drying, the coated support was heated at 40° C. for 14 days and the emulsion layer was then coated with a nuclei coating composition of plate No. 11 in EXAMPLE 1 Japanese Patent Unexamined Publication (Kokai) No. 103104/79.

Lithographic printing plate materials A–E were produced in the same manner as above, except that silver halide of the following composition was employed.

| Lithographic printing plate materials | AgCl | AgBr | AgI |
|---|---|---|---|
| A | 100 | — | — |
| B | 95 | 5 | — |
| C | 75 | 25 | — |
| D | 50 | 50 | — |
| E | 89.5 | 10 | 0.5 |
| | | | (mole %) |

Each of the thus obtained samples in close contact with an original of film block copy containing thin line images was exposed to a light source provided with a dark red filter (manufactured by Fuji Photo Film Co.) which transmitted light having wavelength longer than about 700 mµ. The exposure was by flash exposure for a period in the range of $10^{-3}$–$10^{-5}$ second depending on difference in sensitivity so that nearly the same print exposure was achieved. These were employed as samples for printing test.

Each of thus imagewise exposed samples was developed with the following DTR developers (I)–(V) at 25° C. for 30 seconds. After the development, each sample was passed between two squeeze rollers to remove excess developer, immediately thereafter, treated with a neutralizing solution of the following composition at 25° C. for 20 seconds, passed between squeeze rollers to remove excess solution and dried at room temperature.

|  | Developers | | | | |
| --- | --- | --- | --- | --- | --- |
|  | [I] | [II] | [III] | [IV] | [V] |
| Water | | | 700 ml | | |
| Sodium hydroxide | | | 18 g | | |
| Potassium hydroxide | | | 7 g | | |
| Anhydrous sodium sulfite | | | 50 g | | |
| Hydroquinone | | | 13 g | | |
| Phenidone | | | 1.5 g | | |
| 2-Mercaptobenzoic acid | 1 g | — | 1 g | — | — |
| Sodium thiosulfate | — | 15 g | 15 g | — | 5 g |
| Potassium thiocyanate | — | — | — | 15 g | 15 g |
| Uracil | 10 g | — | — | — | — |
| 2-Methylaminoethanol | 30 ml | — | 30 ml | — | 30 ml |
| 5-Phenyl-2-mercapto-1,3,4-oxadiazole | | | 0.1 g | | |
| Potassium bromide | | | 1.5 g | | |
| Water was added to make up 1 l. | | | | | |

| Neutralizing solution | |
| --- | --- |
| Water | 600 ml |
| Citric acid | 10 g |
| Sodium citrate | 35 g |
| Colloidal silica (20% solution) | 5 ml |
| Ethylene glycol | 5 ml |
| Water was added to make up 1 l. | |

Printing endurance of each lithographic printing plate thus obtained for each developer was shown in Table 1. The test on printing endurance was carried out by mounting on an offset printing machine a sheet to which each of said sample plate was applied, applying the following etch solution onto allover the surface of the plate and carrying out printing with the following damping solution.

The printing machine employed was A. B. Dick 350CD (trademark for an offset printing machine supplied by A. B. Dick Co.). The printing endurance was evaluated in terms of the number of copies delivered before the printing became impossible owing to the dropout of silver and expressed in grade number rated in accordance with the following criteria.

| Grade No. | Number of copies |
| --- | --- |
| 1 | <4000 |
| 2 | 4000–6000 |
| 3 | 6000–8000 |
| 4 | 8000–10000 |
| 5 | >10000 |

| Etch solution | |
| --- | --- |
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Damping solution | |
| o-Phosphoric acid | 10 g |
| Nickel nitrate | 5 g |
| Sodium sulfite | 5 g |
| Ethylene glycol | 100 g |
| Colloidal silica (20% solution) | 28 g |
| Water was added to make up 2 l. | |

TABLE 1

|  | [I] | [II] | [III] | [IV] | [V] |
| --- | --- | --- | --- | --- | --- |
| A | 3 | 2 | 3 | 3 | 3 |
| B | 2 | 2 | 2 | 5 | 5 |
| C | 2 | 2 | 2 | 5 | 5 |
| D | 1 | 1 | 2 | 5 | 5 |
| E | 2 | 2 | 2 | 5 | 5 |

The results of Table 1 show that in the case of developers (I)–(III), the printing endurance tends to decrease with increase of content of silver bromide while in the case of developers (IV) and (V), the printing endurance sharply increases when silver bromide is contained.

EXAMPLE 2

Lithographic printing plate materials were produced in the same manner as in the production of the lithographic printing plate materials A and C of Example 1 except that sensitizing dyes (2), (6), (10), (19) or (28) was used and they were subjected to the same test as in Example 1 with using the developers (I)–(V) to obtain the same results as in Example 1.

EXAMPLE 3

On one side of a subbed polyester film support, was provided a matting layer containing silica powder of 5µ average particle size. On another surface were provided an undercoat layer containing carbon black, hydroquinone and 20% by weight (based on photographic gelatin) of silica powders of 7µ in average particle size and a silver halide emulsion layer (adjusted to pH 4.5) containing 2-mercaptobenzoic acid and 5% by weight (based on photographic gelatin) of silica powders of 7µ in average particle size after subjected to chemical sensitization with a gold compound and hypo.

The above silver halide emulsion was a silver chlorobromide emulsion having an average grain size of 0.7µ and containing 23 mole% of silver bromide and contained $5.4 \times 10^{-7}$ mole of sensitizing dye (15) mentioned hereinbefore for 1 mole of silver halide and $5 \times 10^{-7}$ mole of iridium chloride for 1 mole of silver halide which was added during physical ripening of the emulsion.

The application rate of gelatin in the undercoat layer was 3.0 g/m², that of gelatin in the emulsion layer was 1.0 g/m² and that of silver halide in terms of silver nitrate was 1.0 g/m². These undercoat layer and emulsion layer contained 5.0 mg of formaldehyde as hardener for 1 g of gelatin.

The optical reflective density of the undercoat layer to 780 mµ was 1.14. After drying, the coated support was heated at 40° C. for 14 days. The emulsion layer was then coated with a nuclei coating composition of plate No. 11 in Example 1 of Japanese Patent Unexamined Publication (Kokai) No. 103104/79 to which 0.8 g/m² of hydroquinone was added to obtain lithographic printing plate material F.

Lithographic printing plate material G was produced in the same manner as in production of lithographic plate material F except that the optical reflective density of the undercoat layer was 0.71.

Each of these materials in close contact with an original of film block copy containing thin line images was exposed to a light source provided with a dark red filter SC-70 (supplied by Fuji Photo Film Co.) which transmitted light having a wavelength longer than about 700 mμ for $10^{-5}$ second. These were employed as samples for printing test.

Furthermore, the same exposure as above was carried out using a wedge having a density difference of 0.15. These were employed as samples for sensitometry.

Each of thus imagewise exposed samples was developed with the following diffusion transfer developer at 25° C. for 30 seconds. After development, each sample was passed between two squeeze rollers to remove excess developer, immediately thereafter, treated with the same neutralizing solution as used in Example 1 at 25° C. for 20 seconds, then passed between squeeze rollers to remove excess solution and dried at room temperature.

| Developer | |
|---|---|
| Water | 700 ml |
| Sodium hydroxide | 18 g |
| Potassium hydroxide | 7 g |
| Anhydrous sodium sulfite | 50 g |
| Hydroquinone | 13 g |
| Phenidone | 1 g |
| 2-Methylaminoethanol | 30 ml |
| Potassium thiocyanate | 15 g |
| 5-Phenyl-2-mercapto-1,3,4-oxadiazole | 0.1 g |
| Potassium bromide | 1 g |
| Water was added to make up 1 l. | |

The printing endurance of the samples for printing test was evaluated in the same manner as in Example 1. The sensitivity of the samples for sensitometry was expressed by relative sensitivity assuming the sensitivity of the printing plate material F to be 100. The results are shown in the following Table 2.

TABLE 2

| Sensitivity | F | 100 |
|---|---|---|
| | G | 240 |
| Printing endurance | F | More than 10,000 copies |
| | G | 7,000 copies |

In addition, lithographic printing plate materials H, I and J were produced in the same manner as in production of lithographic printing plate material G except that in place of sensitizing dye (15), there was used sensitizing dye (13) in an amount of $1 \times 10^{-3}$ mole for 1 mole of silver halide (sample H), in an amount of $2.7 \times 10^{-4}$ mole for 1 mole of silver halide (sample I) and in an amount of $9 \times 10^{-5}$ mole for 1 mole of silver halide (sample J). These samples were subjected to the same test as above and the results are shown in Table 3.

TABLE 3

| Sensitivity | H | 130 |
|---|---|---|
| | I | 480 |
| | J | 550 |
| Printing endurance | H | 5,000 copies |
| | I | 8,000 copies |
| | J | 8,000 copies |

Samples I and J could be exposed by Ultre Setter (manufactured by Ultre Co. of U.S.A.) and printing endurance of thus obtained lithographic printing plates was more than 10,000 copies and were good in resolution.

EXAMPLE 4

Example 3 was repeated except that sensitizing dye (22) was used in place of sensitizing dye (13) to obtain the same results as in Example 3.

EXAMPLE 5

Example 3 was repeated except that sensitizing dye (2) was used in place of sensitizing dye (13) to obtain the same results as in Example 3.

EXAMPLE 6

Lithographic printing plate materials were produced in the same manner as in production of lithographic printing plate material G in Example 3 except that in place of sensitizing dye (15), there was used sensitizing dye (13) in an amount of $6 \times 10^{-5}$ for 1 mole of silver halide (sample K), in an amount of $3 \times 10^{-5}$ mole for 1 mole of silver halide (sample L) and in an amount of $1 \times 10^{-5}$ mole for 1 mole of silver halide (sample M) and these were subjected to the same tests as in Example 3. Sample K showed the similar results to sample J and sample L showed the similar results to sample I. Sample M had the sensitivity similar to that of sample F and was much inferior in printing endurance when reflectance of antihalation was raised to increase sensitivity.

EXAMPLE 7

Lithographic printing plate materials were produced in the same manner as in production of lithographic printing plate material J in Example 3 except that refelctive density of the undercoat layer was changed to 0.58 (sample N) and 0.32 (sample P). These samples were subjected to the same tests as in Example 3.

Sample N was higher in sensitivity than sample J, but showed substantially no reduction of resolving power and had the printing endurance similar to that of sample J.

Sample P was further higher in sensitivity than sample N, but showed much reduction of resolving power and dropout of thin line silver images occurred before printing of 5,000 copies for both the cases of contact exposure and exposure by Ultre Setter.

What is claimed is:

1. A method for making a lithographic printing plate which comprises imagewise exposing to light of wavelength greater than 700 mμ, a light sensitive material which comprises a support and at least a silver halide emulsion layer and a surface physical development nuclei layer provided on the support, said emulsion layer comprising silver halide grains which contain at least silver bromide and containing at least one sensitizing dye having a maximum spectral sensitivity in the region of longer than 700 mμ and then developing the exposed light sensitive material with a silver complex diffusion transfer developer containing at least a thiocyanate.

2. A method for making a lithographic printing plate according to claim 1 wherein an antihalation means to keep the reflectance to a light of longer than 700 mμ at 13-40% is provided under the emulsion layer.

3. A method for making a lithographic printing plate according to claim 1 wherein the sensitizing dye is represented by the following general formula (I), (II), (III) or (IV):

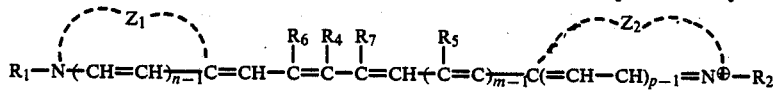
General formula (I)

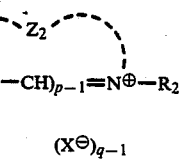

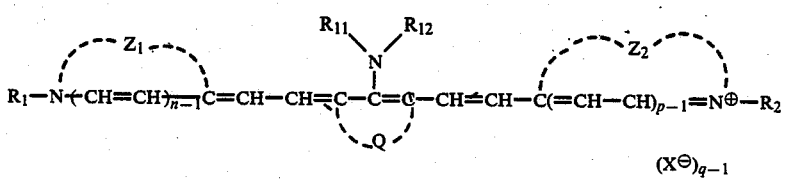
General formula (II)

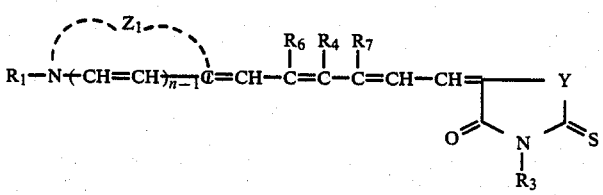
General formula (III)

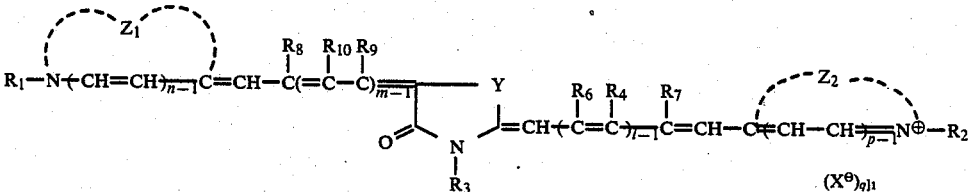
General formula (IV)

wherein $Z_1$ and $Z_2$ which may be identical or different represent a group of atoms necessary for forming a 5- or 6-membered nitrogen containing heterocyclic ring; $R_1$ and $R_2$ which may be identical or different represent alkyl group or alkenyl group; $R_3$ represents an alkyl group, an alkenyl group or an aryl group; $R_4$-$R_{10}$ which may be identical or different represent hydrogen atom, halogen atom, alkyl group, aryl group or alkoxy group and $R_6$ and $R_7$ or $R_8$ and $R_9$ may link to each other to form a 5- or 6-membered ring; $R_{11}$ and $R_{12}$ which may be identical or different represent alkyl group or aryl group and $R_{11}$ and $R_{12}$ may link to each other to form a 5- or 6-membered ring; Y represents sulfur atom, oxygen atom or >N-$R_{13}$ ($R_{13}$ represents an alkyl group); X represents an acid anion; Q represents an ethylene group; and l, m, n, p and q represent 1 or 2.

4. A method for making a lithographic printing plate according to claim 1 wherein the amount of the sensitizing dye is in the range of $1 \times 10^{-5}$-$1 \times 10^{-2}$ mole for 1 mole of silver halide.

5. A method for making a lithographic printing plate according to claim 1 wherein the thiocyanate contained in the developer is potassium thiocyanate, sodium thiocyanate, or ammonium thiocyanate.

6. A method for making a lithographic printing plate according to claim 1 wherein the amount of the thiocyanate is about 0.05-0.3 mole/l.

7. A method for making a lithographic printing plate according to claim 1 wherein content of the silver bromide is about 3-about 60 mole%.

8. A method for making a lithographic printing plate according to claim 2 wherein the amount of the sensitizing dye is $3 \times 10^{-5}$-$3 \times 10^{-4}$ mole.

9. A method for making a lithographic printing plate according to claim 2 wherein the antihalation means is provided in at least one of the undercoat layer, the support and a backing layer.

10. A method for making a lithographic printing plate according to claim 2 wherein the antihalation means is provided by containing a substance capable of absorbing a laser beam of longer than 700 mμ.

11. A method for making a lithographic printing plate according to claim 9 wherein the antihalation means is provided in the undercoat layer contiguous to the emulsion layer.

12. A method for making a lithographic printing plate according to claim 1 wherein the exposure is carried out with a laser beam of longer than 700 mμ.

13. A method for making a lithographic printing plate according to claim 12 wherein the exposure is carried out with a laser beam of longer than 750 mμ.

14. A method of printing which comprises the steps of:
(1) imagewise exposing to light of wavelength greater than 700 μm, a light sensitive material which comprises a support and at least a silver halide emulsion layer and a surface physical development nuclei layer provided on the support, said emulsion layer comprising silver halide grains which contain at least silver bromide and containing at least one sensitizing dye having a maximum spectral sensitivity in the region of longer than 700 μm;
(2) developing the exposed light sensitive material with a silver complex diffusion transfer developer containing at least a thiocyanate to obtain a lithographic printing plate;
(3) mounting the lithographic printing plate on a printing machine;
(4) applying an ink on the lithographic printing plate; and
(5) carrying out printing operation.

* * * * *